United States Patent [19]

Reczek et al.

[11] Patent Number: 5,426,323
[45] Date of Patent: Jun. 20, 1995

[54] INTEGRATED SEMICONDUCTOR CIRCUIT WITH ESD PROTECTION

[75] Inventors: Werner Reczek; Hartmud Terletzki, Ottobrunn, both of Germany

[73] Assignee: Siemens Aktiengesellschaft, Munich, Germany

[21] Appl. No.: 238,243

[22] Filed: May 4, 1994

[30] Foreign Application Priority Data

May 4, 1993 [EP] European Pat. Off. ........... 93107222

[51] Int. Cl.⁶ ..................... H01L 29/06; H01L 29/78
[52] U.S. Cl. ................... 257/360; 257/363; 361/58; 361/91
[58] Field of Search ................ 257/358, 360, 363; 361/58, 91

[56] References Cited

U.S. PATENT DOCUMENTS

| | | | |
|---|---|---|---|
| 4,893,157 | 1/1990 | Miyazawa et al. | 257/360 |
| 4,893,159 | 1/1990 | Suzuki et al. | 257/360 |
| 4,987,465 | 1/1991 | Longcor et al. | |
| 5,019,883 | 5/1991 | Mori et al. | 257/360 |
| 5,027,252 | 6/1991 | Yamamura | 257/360 |

FOREIGN PATENT DOCUMENTS

| | | | |
|---|---|---|---|
| 0106417 | 4/1984 | European Pat. Off. | 257/360 |
| 3907523 | 9/1990 | Germany . | |
| 3918090 | 12/1990 | Germany . | |
| 59-224164 | 12/1984 | Japan | 257/360 |

OTHER PUBLICATIONS

"A Synthesis of ESD Input Protection Scheme", Duvvury et al., 1991 EOS/ESD Symposium Proceedings, pp. 88–97.
"ESD Protection: Design and Layout Issues for VLSI Circuits", Duvvury et al., 1989 IEEE.

*Primary Examiner*—Ngân V. Ngô
*Attorney, Agent, or Firm*—Herbert L. Lerner; Laurence A. Greenberg

[57] ABSTRACT

An integrated semiconductor circuit includes a semiconductor substrate. At least one first and at least one second potential rail respectively carry first and second supply potentials of the semiconductor circuit during operation. At least one input signal line has at least one input signal terminal and at least one output signal line has at least one output signal terminal and at least one additional line connected to the output signal terminal. At least one first circuit portion receives and processes input signals and at least one second circuit portion develops at least one output signal of the semiconductor circuit during operation of the semiconductor circuit. A configuration for protection against overvoltages has a first protection circuit for each input signal terminal being connected between a respective input signal terminal and a respective first circuit portion, and has a second protection circuit for each output signal terminal being connected to the additional line. Each protection circuit has a field oxide transistor, a field-controlled diode and a diffusion resistor. The potential rails each have a region adjacent at least one of the protection circuits. At least one of the potential rails has a tub-shaped protection structure disposed under the region. The protection structure is disposed in the substrate and is electrically conductively connected to a respective one of the potential rails.

46 Claims, 7 Drawing Sheets

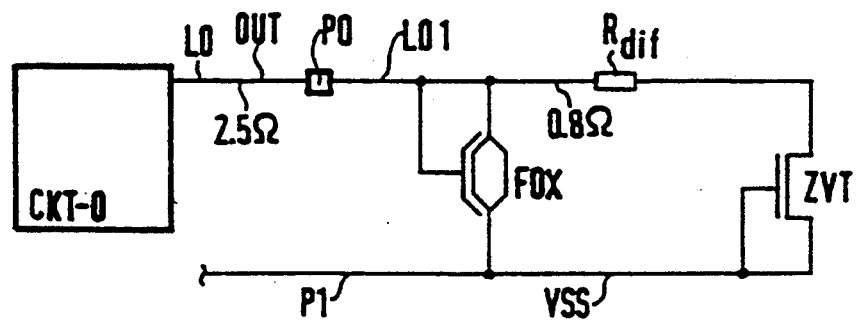
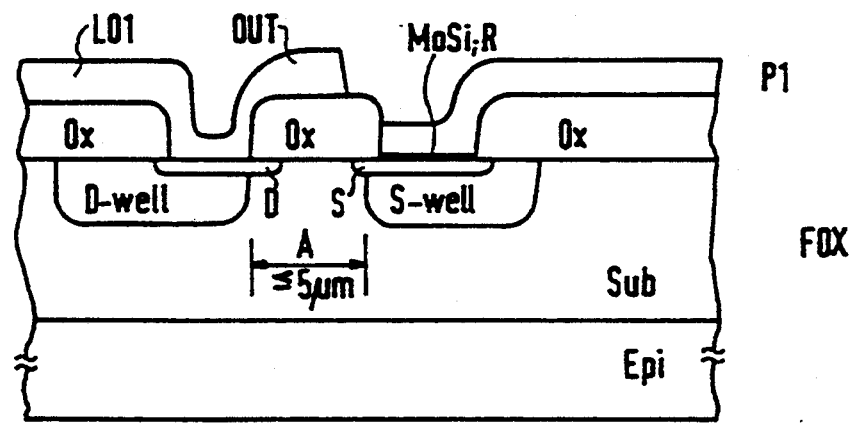
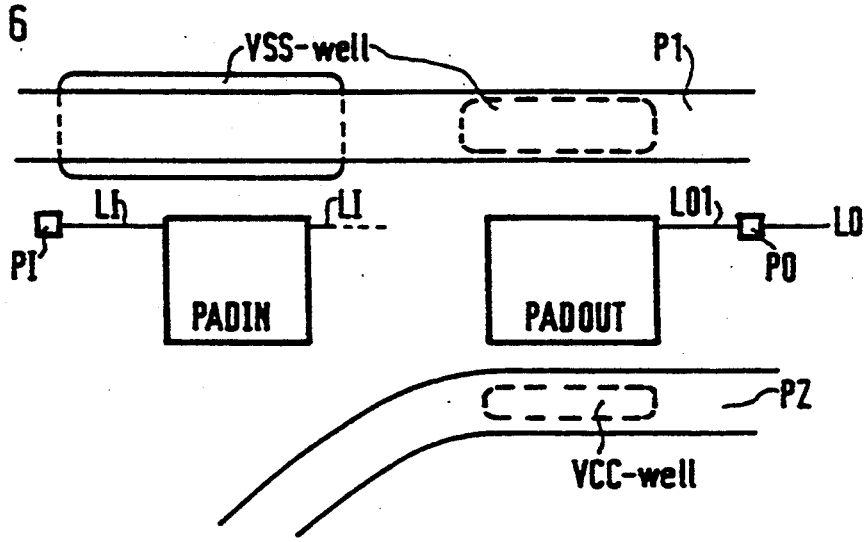

INTEGRATED SEMICONDUCTOR CIRCUIT WITH ESD PROTECTION

BACKGROUND OF THE INVENTION

Field of the Invention

The invention relates to an integrated semiconductor circuit having a semiconductor substrate; at least one first potential rail which carries a first supply potential of the semiconductor circuit in operation; at least one second potential rail which carries a second supply potential of the semiconductor circuit in operation; at least one first circuit portion for receiving and processing input signals; at least one second circuit portion in which at least one output signal of the semiconductor circuit is developed in operation of the semiconductor circuit; and a configuration for protection against overvoltages, which includes a first protection circuit for each terminal for a line carrying one of the input signals, which is disposed between the respective terminal and a respective first circuit portion and which includes a field oxide transistor and a field-controlled diode disposed electrically parallel with one another between the line carrying the input signal and the first potential rail, the gate of the field oxide transistor is connected to the line, the field control of the diode is effected through the first potential rail, and the field oxide transistor and the field-controlled diode are electrically connected to the line carrying the input signal at various points of that line; the line carrying the input signal includes a diffusion resistor between the two points; a respective tub-shaped region is formed in the field oxide transistor, beneath the source region and beneath the drain region, which regions are spaced apart from one another and are both of the same conduction type as the source and drain regions.

One such semiconductor circuit is known from U.S. Pat. No. 4,987,465 and German Published, Non-Prosecuted Application DE 39 18 090 A1. Integrated semiconductor circuits, in particular MOS integrated semiconductor circuits, are known to be vulnerable to electrostatic discharge (ESD), if such discharges act on their terminals (pads on the semiconductor chip, and pins on the semiconductor circuit housing). Tests of known semiconductor circuits have shown that although they have improved protection against ESD effects as compared with the past, nevertheless the protection is still not sufficient to meet current wishes.

SUMMARY OF THE INVENTION

It is accordingly an object of the invention to provide an integrated semiconductor circuit, which overcomes the hereinafore-mentioned disadvantages of the heretofore-known devices of this general type and which does so in such a way that they meet even higher requirements for ESD protection.

With the foregoing and other objects in view there is provided, in accordance with the invention, an integrated semiconductor circuit, comprising a semiconductor substrate; at least one first potential rail carrying a first supply potential of the semiconductor circuit during operation; at least one second potential rail carrying a second supply potential of the semiconductor circuit during operation; at least one input signal line having at least one input signal terminal; at least one output signal line having at least one output signal terminal and at least one additional line connected to the output signal terminal; at least one first circuit portion for receiving and processing input signals; at least one second circuit portion developing at least one output signal of the semiconductor circuit during operation of the semiconductor circuit; a configuration for protection against overvoltages having a first protection circuit for each input signal terminal being connected between a respective input signal terminal and a respective first circuit portion, and having a second protection circuit for each output signal terminal being connected to the additional line; the first protection circuit having: a field oxide transistor and a field-controlled diode disposed electrically parallel with one another between the input signal line and the first potential rail, the field oxide transistor having a gate being connected to the input signal line, the diode having a field control being effected through the first potential rail, and the field oxide transistor and the field-controlled diode being electrically connected to the input signal line at various points along the input signal line; a diffusion resistor in the input signal line between two of the points; the field oxide transistor having a source region, a drain region and respective tub-like regions being formed beneath the source and drain regions, being mutually spaced apart and both being of the same conduction type as the source and drain regions; the second protection circuit having: a field oxide transistor and a field-controlled diode disposed electrically parallel with one another between the additional line and the first potential rail, the field oxide transistor having a gate being connected to the additional line, the diode having a field control being effected through the first potential rail, and the field oxide transistor and the field-controlled diode being electrically connected to the additional line at various points along the additional line; a diffusion resistor in the additional line between two of the points; the field oxide transistor having a source region, a drain region and respective tub-like regions being formed beneath the source and drain regions, being mutually spaced apart and both being of the same conduction type as the source and drain regions; and the potential rails each having a region adjacent at least one of the protection circuits, and at least one of the potential rails having a tub-shaped protection structure disposed under the region, the protection structure being disposed in the substrate and being electrically conductively connected to a respective one of the potential rails.

In accordance with another feature of the invention, there is provided a region being disposed between the protection structure and a corresponding one of the potential rails, having an increased doping as compared with the protection structure.

In accordance with a further feature of the invention, at least one of the protection structures extends as far as a respective one of the terminals.

In accordance with an added feature of the invention, the protection structures are at least 5 μm wide.

In accordance with an additional feature of the invention, the protection structure has a width being at least 10% of a width of the potential rail disposed above it.

In accordance with yet another feature of the invention, at least one of the protection structures has a conduction type being opposite a condition type of the semiconductor substrate.

In accordance with yet a further feature of the invention, at least one of the protection structures has a conduction type being the same as a conduction type of the semiconductor substrate.

In accordance with yet an added feature of the invention, there is provided an epitaxial layer on which the semiconductor substrate is disposed.

In accordance with yet an additional feature of the invention, the at least one additional line has a lower impedance than the at least one output signal line.

In accordance with again another feature of the invention, the at least one output signal line has a resistance of at least two ohms.

In accordance with again a further feature of the invention, the at least one output signal line has a resistance being distributed uniformly over a region between one of the terminals and the second circuit portion.

In accordance with again an added feature of the invention, the tub-like regions beneath the field oxide transistor of a respective one of the protection circuits have a mutual spacing being at most equal to a spacing value that other tub-like regions of different potentials occurring outside the protection configuration of the semiconductor circuit and having the same conduction type as the tub-like regions of the field oxide transistor have as a minimum as corresponding spacing values.

In accordance with again an additional feature of the invention, there is provided a multiplicity of contacts electrically connecting the source and drain regions of the field oxide transistor of the first protection circuit with the respective underlying tub-like regions.

In accordance with still another feature of the invention, the tub-like regions of the first protection circuit additionally have a region of higher doping through which electrical contacting with the source and drain regions of the field oxide transistor takes place.

In accordance with still a further feature of the invention, there is provided a multiplicity of contacts electrically connecting the source and drain regions of the field oxide transistor of the second protection circuit with the respective underlying tub-like regions.

In accordance with still an added feature of the invention, the tub-like regions of the second protection circuit additional have a region of higher doping through which electrical contacting with the source and drain regions of the field oxide transistor takes place.

In accordance with still an additional feature of the invention, the field oxide transistor of the first protection circuit is a finger transistor.

In accordance with another feature of the invention, the field oxide transistor of the second protection circuit is a finger transistor.

In accordance with a further feature of the invention, the finger transistor has corners with finger tips, and at least the finger tips are chamfered.

In accordance with an added feature of the invention, the diffusion resistors have a large surface area.

In accordance with an additional feature of the invention, the protection circuits are each disposed in the immediate vicinity of a respective one of the terminals.

In accordance with again another feature of the invention, the field-controlled diodes are zero voltage transistors.

In accordance with again a further feature of the invention, the zero voltage transistors have gates each being in the shape of a barbell.

In accordance with again an added feature of the invention, the zero voltage transistors each have a gate with a spacing from a respective source and from a respective drain that amounts to at least 1.5 times a spacing value that transistors contained outside the protection configuration in the semiconductor circuit have as a minimum as corresponding spacing values.

In accordance with again an additional feature of the invention, there is provided at least one pass gate transistor connected downstream of the first protection circuit.

In accordance with still another feature of the invention, the pass gate transistor has a gate receiving the second supply potential.

In accordance with still a further feature of the invention, the pass gate transistor has a gate through which it is switched.

In accordance with still an added feature of the invention, the pass gate transistor has a source, a drain and a gate being spaced from the source and the drain by a spacing that amounts to at least 1.5 times a spacing value that transistors contained outside the protection configuration in the semiconductor circuit have as a minimum as corresponding spacing values.

In accordance with still an additional feature of the invention, there is provided a molybdenum silicide layer connecting the source region of the field oxide transistor of at least one of the protection circuits to the first potential rail.

In accordance with another feature of the invention, there is provided a resistor connecting the source region of the field oxide transistor of at least one of the protection circuits to the first potential rail, the resistor having a resistance being at least five times a resistance that would result if the source region of the field oxide transistor of the at least one protection circuit were connected to the first potential rail without the resistor.

In accordance with a further feature of the invention, there is provided a molybdenum silicide layer connecting the drain region of the field oxide transistor of at least one of the protection circuits to one of the lines.

In accordance with an added feature of the invention, there is provided a resistor connecting the drain region of the field oxide transistor of at least one of the protection circuits to one of the lines, the resistor having a resistance being at least five times a resistance that would result if the drain region of the field oxide transistor of the at least one protection circuit were connected to the one line without the resistor.

In accordance with and additional feature of the invention, there is provided at least one diode being disposed between the first and second potential rails and blocking during normal operation of the semiconductor circuit.

In accordance with again another feature of the invention, the at least one diode is more than one diode being disposed at mutual spacings of a maximum of 10 mm.

In accordance with again a further feature of the invention, the diodes are disposed at regular intervals.

In accordance with again an added feature of the invention, there is provided at least one other field oxide transistor being disposed between the first and second potential rails and having a gate being connected to the second potential rail.

In accordance with again an additional feature of the invention, the at least one other field oxide transistor is a plurality of other field oxide transistors being disposed at mutual spacings of a maximum of 10 mm.

In accordance with still another feature of the invention, the other field oxide transistors are disposed at regular intervals.

In accordance with still a further feature of the invention, there is provided at least one pair of two antiparallel-connected diode devices connecting together a plurality of the potential rails carrying the same supply potential during operation.

In accordance with still an added feature of the invention, one of the diode devices has at least one series-connected diode.

In accordance with still an additional feature of the invention, the pairs of diode devices are connected in a star pattern to one of the potential rails having the lowest ohmic resistance.

In accordance with another feature of the invention, the plurality of potential rails carrying the same supply potential during operation each have their own potential terminal, and the at least one pair of diode devices is connected to the respective potential terminals.

In accordance with a further feature of the invention, the pairs of diode devices are connected in a star pattern to that potential terminal of the potential rails having the same potential and being connected to the potential rail with the lowest ohmic resistance.

In accordance with an added feature of the invention, there is provided at least one terminal carrying a substrate bias potential during operation of the semiconductor circuit; a field oxide transistor being connected between the at least one terminal and the first potential rail and having a gate being connected to the at least one terminal; and one further tub-like region in the field oxide transistor being disposed at least partially beneath one of the drain and source regions.

In accordance with a concomitant feature of the invention, the terminals can carry both an input signal and an output signal during operation, and the first protection circuit also functions as a second protection circuit.

Other features which are considered as characteristic for the invention are set forth in the appended claims.

Although the invention is illustrated and described herein as embodied in an integrated semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2 and 4 are block and schematic circuit diagrams, FIGS. 3, 5, 7, 8, 10 and 12 are fragmentary, diagrammatic, cross-sectional views and FIGS. 6 and 11 are fragmentary, diagrammatic, plan views, of the semiconductor circuit;

DESCRIPTION OF THE PREFERRED EMBODIMENTS

Figure 1:
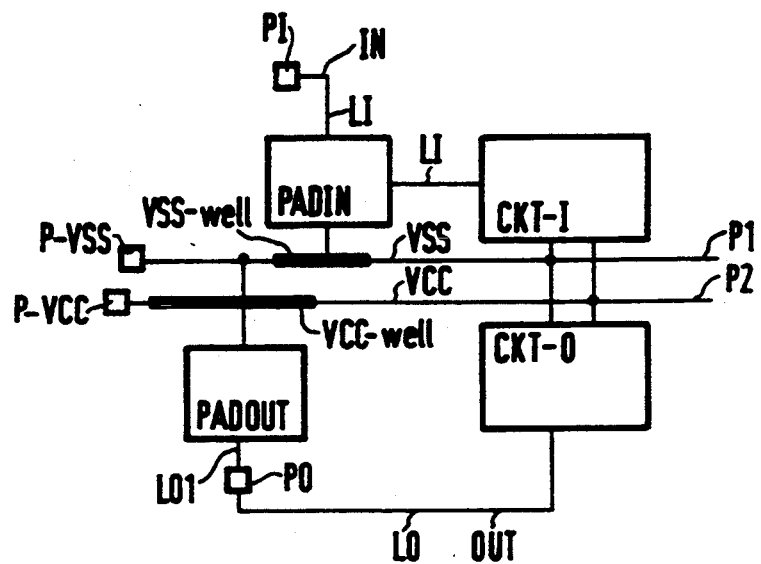
FIG. 1 is a block and schematic diagram of essential parts of a semiconductor circuit according to the invention.

Referring now in detail to the figures of the drawing, all of which show oxide regions "Ox" and first, particularly, to FIG. 1 thereof, there is seen a semiconductor circuit according to the invention which includes first circuit portions CKT-I and second circuit portions CKT-O (although for the sake of simplicity, only one first and one second circuit portion are shown). Each first circuit portion CKT-I serves to receive and further process an input signal IN, which as usual is applied during operation of the semiconductor circuit to a corresponding terminal PI. In an integrated circuit with a housing, such terminals are typically called pins, whereas on the semiconductor chip itself, they are called pads. During operation, every other circuit portion CKT-O generates an output signal OUT of the semiconductor circuit, which is then made available externally of the circuit through a corresponding terminal PO (also called a pin or pad). Serving as a voltage supply are (at least) one first supply potential VSS (typically called ground) and one second supply potential VCC. The supply potentials VSS, VCC are delivered to the semiconductor circuit during operation through corresponding potential terminals P-VSS, P-VCC. Within the semiconductor circuit, the first and second supply potentials VSS, VCC are carried, in the form of first and second potential rails P1, P2 in the manner of potential buses, to the voltage supply of the circuit portions CKT-I, CKT-O.

The integrated semiconductor circuit also includes an overvoltage protection configuration (ESD protection) with first and second protection circuits PADIN, PADOUT. Each first protection circuit PADIN is disposed between a terminal PI for a corresponding input signal IN and the first circuit portion CKT-I belonging to this terminal PI. A line carrying such an input signal IN which first connects the terminal PI with the first protection circuit PADIN and then connects the first protection circuit PADIN to the first circuit portion CKT-I, is identified below by reference symbol LI.

Figure 2:
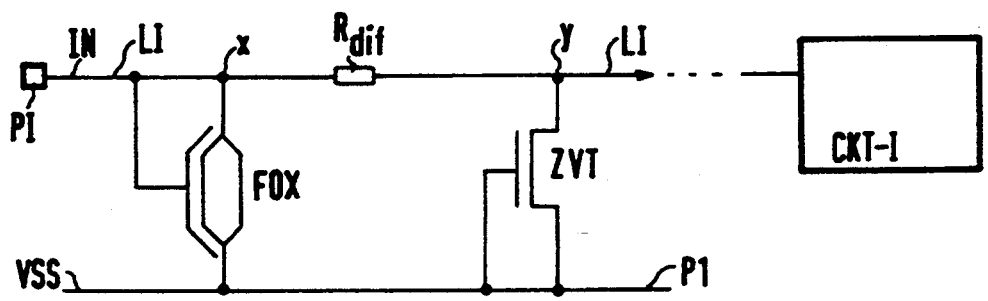

A first protection circuit PADIN has the following layout, which is shown in FIG. 2: disposed between the line LI carrying the applicable input signal IN and the first potential rail P1 is a field oxide transistor FOX having a gate which is connected to the line LI. A connection point of the field oxide transistor FOX to the line LI is referred to below as "x". As the line LI continues, following the point x, there is a diffusion resistor $R_{dif}$. One terminal of a field-controlled diode ZVT is located at or shortly after the end of the diffusion resistor $R_{dif}$. Another terminal of the field-controlled diode ZVT is likewise connected to the first potential rail P1. A further terminal of the field-controlled diode ZVT forms a further point y of the line LI. In the exemplary embodiments, it is assumed that the field-controlled diode ZVT is constructed as a so-called zero voltage transistor. Other versions of field-controlled diodes are possible and known as such to one skilled in the art. In the zero voltage transistor of FIG. 2 functioning as a field-controlled diode ZVT, a gate bringing about the field control (like its source) is connected to the first potential rail P1.

Figure 3:
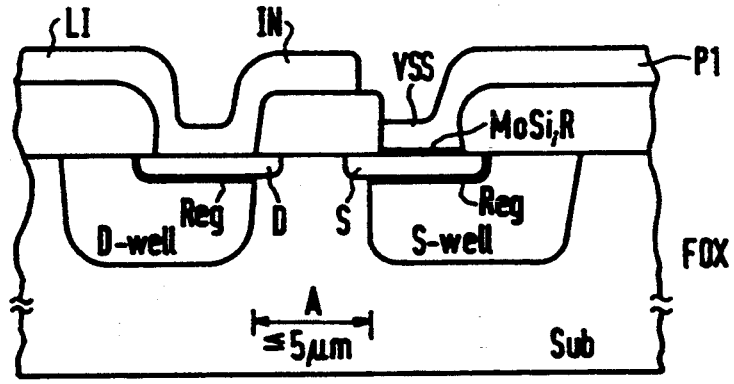

As usual, source and drain regions of the field oxide transistor FOX are constructed as diffusion zones (source region S, drain region D). A tub-shaped region S-well and D-well are each constructed beneath the source region S and the drain region D, respectively. These tub-shaped regions S-well, D-well are spaced apart from one another, as is shown in FIG. 3. They are of the same conduction type as the respective source or drain region S, D.

The layout of the second protection circuits PADOUT corresponds to that of the first protection circuits PADIN. However, the second protection circuits are disposed differently from the first. As described above, the first protection circuits PADIN are disposed between a respective terminal PI for an input signal IN and a first circuit portion CKT-I. However, as is shown in FIGS. 1 and 4, in the second protection circuits PADOUT, the respective terminals PO for output signals OUT are connected directly to the second circuit portions CKT-O through a respective corresponding line LO, and the respective second protection circuit PADOUT is connected to the respective terminal PO by means of one additional (as compared with the corresponding line LO) line LO1.

As mentioned above in the description of FIG. 4, a second protection circuit PADOUT is connected by means of one additional line LO1 to a corresponding terminal PO carrying an output signal OUT. The second protection circuit PADOUT includes a field oxide transistor FOX, which is disposed between the additional line LO1 and the first potential rail P1. A terminal of the field oxide transistor FOX connected to the additional line LO1 is connected to one terminal of a field-controlled diode ZVT through a diffusion resistor $R_{dif}$. Another terminal of the field-controlled diode ZVT is in turn connected to the first potential rail P1. In FIG. 4, the field-controlled diode ZVT is constructed as a zero voltage transistor, like the field-controlled diode of a first protection circuit PADIN of FIG. 2, and it has a gate connected to the first potential rail P1 in order to carry out the field control.

As is seen in FIG. 5, beneath the source and drain regions S, D of the field oxide transistor FOX (which are again constructed as diffusion zones), tub-shaped regions S-well, D-well are again formed, corresponding to those of the first protection circuits PADIN. These tub-shaped regions S-well, D-well are again spaced apart from one another, and they are of the same conduction type as the respective source and drain regions S, D.

As is shown in FIGS. 1 and 6, the protection configuration of the integrated semiconductor circuit according to the invention also includes tub-shaped protection structures VSS-well, VCC-well. Either the first potential rail P1 or the second potential rail P2 or the first and second potential rails P1, P2 are underlain by a respective protection structure VSS-well and VCC-well, which is electrically conductively connected to the respective potential rail P1 or P2, in regions in which at least one of the protection circuits PADIN, PADOUT is adjacent to these respective rails. The protection structures VSS-well, VCC-well are constructed in tub-like fashion in a substrate Sub.

It has been demonstrated that integrated semiconductor circuits which have an ESD protection configuration with the characteristics described above are protected against ESD phenomena having ESD values, as measured by the Human Body Model, MIL-STD-883C, method 3015.7, which are 4 kV and more. Such protection is unattainable in the integrated semiconductor circuits of the prior art described above.

The protection circuits PADIN, PADOUT are advantageously disposed on the semiconductor chip in the immediate vicinity of the particular terminals PI, PO (and possibly PIO, that will be described below), with which the respective protection circuit PADIN, PADOUT is connected.

FIG. 5 shows a version of a field oxide transistor FOX of a second protection circuit PADOUT, in which the source region S of the field oxide transistor FOX is connected to the first potential rail P1, in order to attain an increased junction resistance across a molybdenum silicide layer MoSi. Alternatively, or optionally as a supplement thereto, a connection of the source region S to the first potential rail P1 is conceivable, by using a resistor R that has at least five times the resistance which would result without using this resistor R as a junction resistor in this connection (which is indicated in FIG. 5 by a reference symbol "R" as an alternative to "MoSi"). The same is also possible for the source region S of a field oxide transistor FOX of a first protection circuit PADIN, as is shown in FIG. 3. The advantage attainable with the above provisions is that what is known as "spiking" and its consequences at junctions between a conductor track and a diffusion zone are avoided, thereby increasing the ESD resistance.

Figure 12:
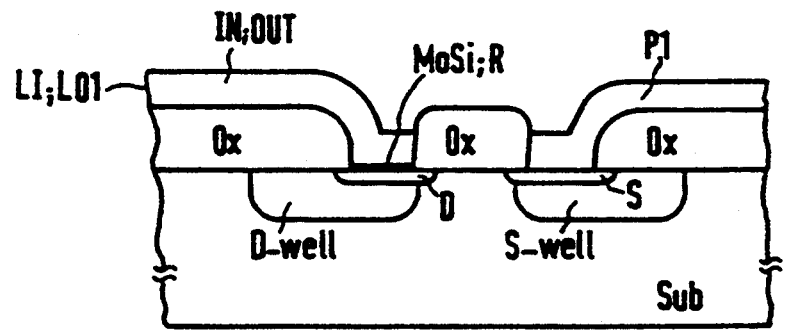

FIG. 12 shows a variant of the structure described above: in this case a drain region D of a field oxide transistor FOX of a first protection circuit PADIN (or of a second protection circuit PADOUT) is connected to the line LI carrying the input signal (or to the additional line LO1 carrying the output signal OUT), either through a molybdenum-silicide layer MoSi and/or by using a resistor R. In order to dimension the resistor R and for the purpose of this provision, the same description may be given as was given above for FIG. 5.

In the version of FIG. 6, in which the terminal PI for the input signal IN and the respective first protection circuit PADIN are disposed along one or both potential rails P1, P2 (for instance, along the first potential rail P1, as shown), it is advantageous if the applicable protection structure VSS-well (or VCC-well) extends far enough to reach the respective terminal PI. The same also applies to a corresponding terminal PO for an output signal and the corresponding second protection circuit PADOUT.

Figure 7:
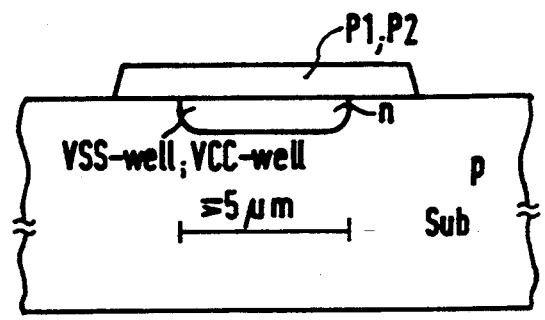
Figure 8:
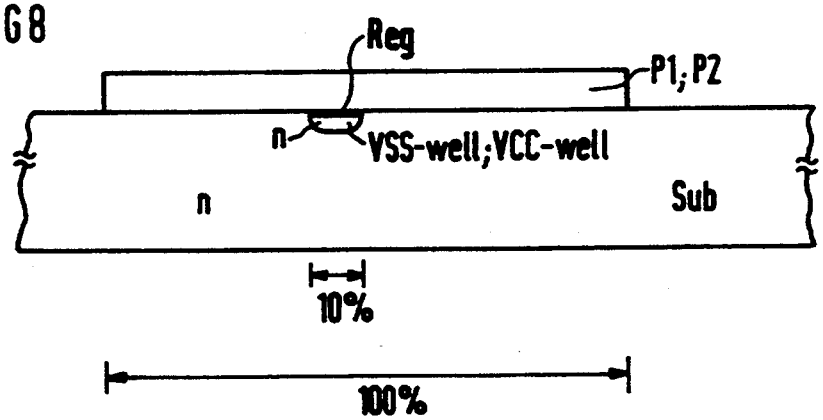

It is also advantageous, as is shown in FIGS. 6 and 7, if the protection structures VSS-well and VCC-well are at least 5 m wide, or if the width of a protection structure VSS-well or VCC-well, as is shown in FIGS. 6 and 8, amounts to at least 10% of the width of the respective potential rail P1 or P2 located above it. The protection structures VSS-well or VCC-well may also be wider than the respective potential rail P1 or P2 located above it, as is seen in FIG. 6.

It is also advantageous, as is shown in FIG. 8, if a region Reg that has doping which is increased as compared with the protection structure VSS-well or VCC-well is disposed between a respective potential rail P1 or P2 and its associated protection structure VSS-well or VCC-well. In this way a reduced junction resistance between the potential rail and the protection structure is attained.

FIG. 7 also shows another advantageous feature of the protection structures VSS-well and VCC-well: in this case, the respective protection structure VSS-well or VCC-well is of the opposite conduction type from the substrate Sub. In FIG. 8, however, they may also be of the same conduction type. As is shown in FIG. 5, the substrate Sub may also be disposed on an epitaxial layer Epi, just as an SOS layout (SOS=Silicon On Sapphire) is also possible.

Figure 9:
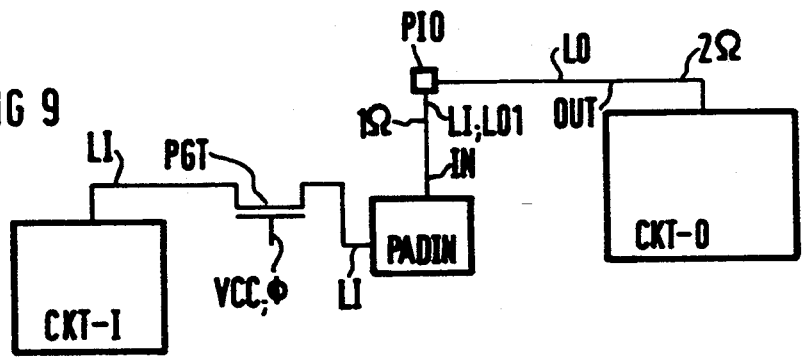
FIG. 9 is a block and schematic circuit diagram of an advantageous embodiment with so-called I/O terminals.

FIG. 9 shows a portion of an integrated semiconductor circuit with a terminal PIO, which can carry both an input signal IN and an output signal OUT (so that it is a so-called I/O terminal) during operation. Correspondingly, both a second circuit portion CKT-O and a first circuit portion CKT-I are connected to such a terminal PIO. In the case of such a terminal PIO, only a single first protection circuit PADIN is provided, which is disposed between the terminal PIO and the first circuit portion CKT-I. During operation this single first protection circuit PADIN has both the protection function of the first protection circuit PADIN and that of a second protection circuit PADOUT. A portion of the line LI that is located between the terminal PIO and the first protection circuit PADIN acts as a further line LO1 with respect to the second circuit portion CKT-O.

In the version of FIG. 9, a pass gate transistor PGT has a source-to-drain path between the first protection circuit PADIN and the first circuit portion CKT-I. A gate of the pass gate transistor PGT is connected either to the second supply potential VCC or to a clock signal Φ. In the case in which the gate is connected to the second supply potential VCC of the semiconductor circuit during operation, the pass gate transistor PGT is conducting during operation. In the other case, in which the gate is connected to the clock signal Φ during operation, the pass gate transistor PGT is made conducting for the input signal IN whenever the clock signal Φ has its active level (in the case of an n-channel transistor as the pass gate transistor PGT: the clock signal Φ has a high level). In this other case, it is accordingly possible to block the pass gate transistor PGT by means of the clock signal Φ whenever the I/O terminal PIO is just then functioning as a terminal for the output signal OUT, and to make the pass gate transistor PGT electrically conducting whenever the I/O terminal PIO is just then functioning as a terminal for the input signal IN. Pass gate transistors PGT can also be provided in first protection circuits PADIN of the kind that are connected to terminals PI and which carry only input signals IN during operation.

Figure 10:
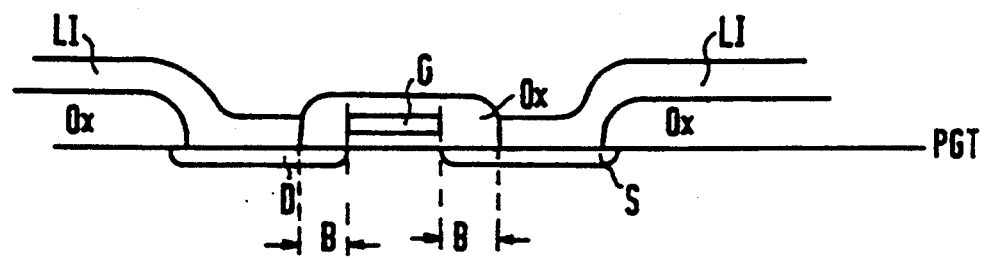

FIG. 10 shows an advantageous dimensioning of the pass gate transistor PGT: a gate G has a spacing B from both the source S and the drain D. This spacing in each case is at least 1.5 times the corresponding spacing values in transistors that the integrated semiconductor circuit contains outside the protection configuration (for instance, in the circuit portions CKT-I, CKT-O).

It is also advantageous, as is indicated in FIGS. 4 and 9 by exemplary indications "0.8 Ω" and "2.5 Ω" or "1 Ω" and "2 Ω" for the additional lines LO1 to have lower impedance than the lines LO carrying the respective output signal OUT. In such a configuration, the respective second protection circuit PADOUT (or the first protection circuit PADIN in the case of I/O terminals PIO as in FIG. 9) can respond faster to an incipient ESD phenomenon than without such a provision. The lines LO carrying the respective output signal OUT should have a resistance of at least 2 Ω, which is distributed uniformly over the region between the respective terminal PO (or PIO) and the associated second circuit portion (CKT-O).

In any integrated semiconductor circuit with first circuit portions CKT-I and second circuit portions CKT-O, which have tub-like regions of the same conductivity type that carry different potentials during operation, it is known that the minimum mutual spacing value which such tub-shaped regions must have is fixed by specification and by construction rules. In an integrated semiconductor circuit according to the invention, it is advantageous if the tub-like regions S-well and D-well of the field oxide transistors FOX of the protection circuits PADIN, PADOUT have mutual spacings A per field oxide transistor FOX that do not exceed the above-mentioned minimum spacing value. This is also shown in FIGS. 3 and 5 in terms of an exemplary (minimal) spacing value of $\leq 5$ μm. It is also advantageous, with a view toward an integrated semiconductor circuit that is optimally protected against ESD phenomena, if the source and drain regions S, D of the field oxide transistors FOX of the first protection circuits PADIN and/or the second protection circuits PADOUT are connected through a number of electrical contacts to the respective tub-like region S-well or D-well located beneath them. This may be done, for instance, by means of regions Reg that have a higher doping than the corresponding tub-like regions S-well, D-well. FIG. 3 shows the field oxide transistor FOX of a first protection circuit PADIN with such higher-doped regions Reg.

FIG. 11, which is again highly diagrammatic, shows one possible advantageous layout of a protection circuit, in a plan view. For the sake of simplicity, this illustration of the field oxide transistor FOX shows only a source S and a drain D but not the gate of the field oxide transistor FOX. The illustration is valid for both a first protection circuit PADIN and a second protection circuit PADOUT. The field oxide transistor FOX is constructed as a finger transistor. In other words, the source S and the drain D are constructed in finger-like or comb-like fashion. One source finger in each case comes to be located next to a drain finger, and vice versa. Such an embodiment is already known per se from German Published, Non-Prosecuted Application DE 39 07 523 A. It is described therein as being meander-like. In a further feature of these finger transistors, which are already known per se, the finger tips, that is the ends of the various transistor fingers, are chamfered at the corners. It is also possible to construct the finger transistors in such a way that all of the corners of the finger transistors are chamfered. The chamfering can also take the form of rounding.

The diffusion resistor $R_{dif}$, which is disposed between the drain D of the field-controlled diode ZVT that is constructed as a zero voltage transistor, and the drain D of the field oxide transistor FOX, is constructed with a large surface area within the surface area available to it. In other words, for a given resistance, with a defined specific resistance per unit of cross-sectional area, it is constructed as maximally long and wide, resulting in the largest possible surface area for the resistor $R_{dif}$. In operation, this makes it easier to dissipate the power loss (heat) occurring in the diffusion resistor $R_{dif}$.

Figure 11:
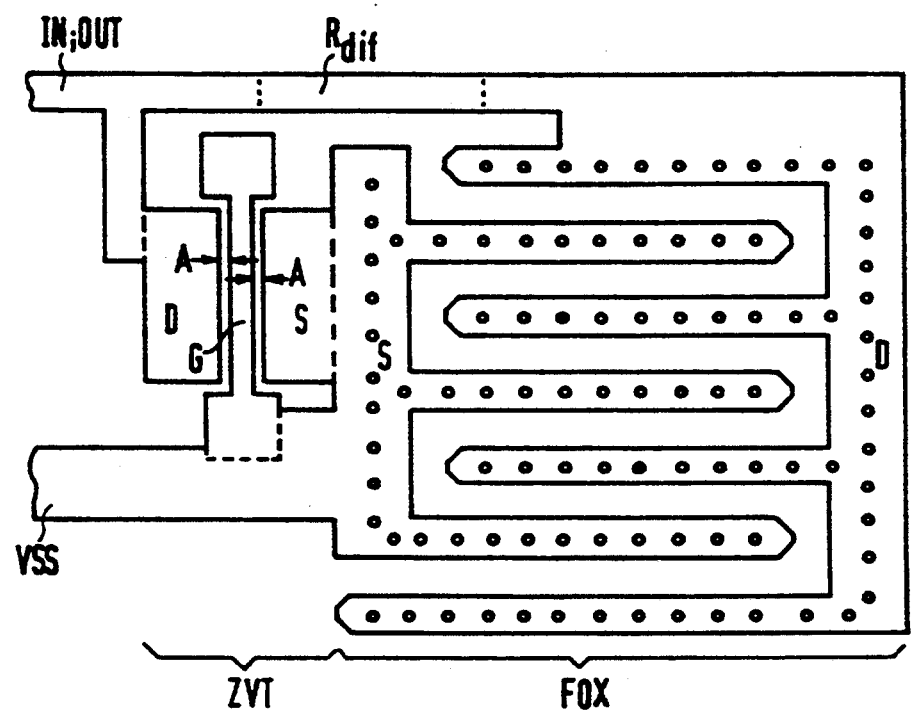

The field-controlled diode ZVT is constructed in FIG. 11 as a zero voltage transistor, having a gate G which is constructed in the shape of a barbell or a bone. In the region between the source S and the drain D, the zero voltage transistor has a constant width, so that in this way as well the occurrence of ESD damage is maximally precluded. The gate G of the zero voltage transformer is advantageously spaced apart from the source S and from the drain D of the zero voltage transistor by values A that amount to at least 1.5 times the corresponding spacing values of transistors that the integrated semiconductor circuit contains outside the protection configuration (for instance, in the circuit portions CKT-I, CKT-O).

Figure 13:
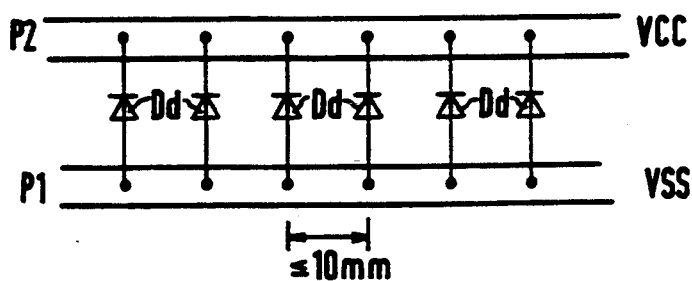
FIGS. 13 to 19 are schematic circuit diagrams and FIGS. 20 and 21 are fragmentary, cross-sectional views, of advantageous further developments of the invention.

Some additional provisions that are advantageous for avoiding ESD damage are described below. They pertain to the potential rails P1, P2 for the supply potentials VSS, VCC, or to lines for a substrate bias potential VBB that may possibly be present in the integrated semiconductor circuit. FIG. 13 shows a plurality of diodes Dd, which are disposed between the two potential rails P1, P2, in such a way that during regular operation of the integrated semiconductor circuit they block. If an ESD event then occurs, in which the potential rail P1 that carries the first supply potential VSS during operation receives a more-positive potential than the second potential rail P2 (which carries the second supply potential VCC in operation that is assumed to be more-positive than VSS) has, then this more positive potential caused by the ESD event is dissipated through the diodes Dd to the second potential rail P2 and thus rendered harmless. It is appropriate, if more than one diode Dd is present (as shown) for these diodes to be disposed with a maximum mutual spacings of 10 mm, and for them to be disposed at regular intervals with respect to one another.

Figure 14:
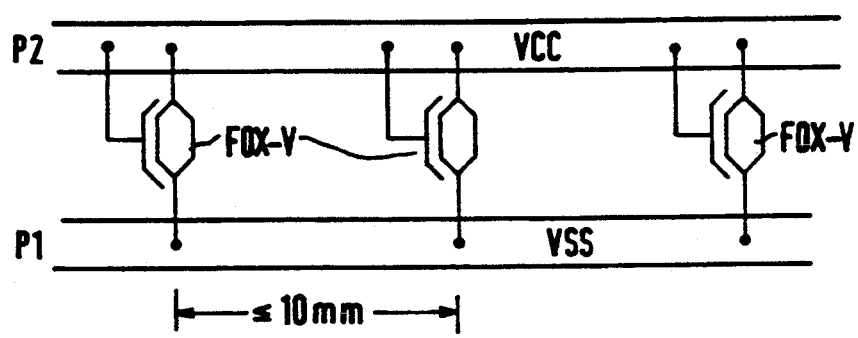

FIG. 14 shows a configuration corresponding to FIG. 13, in which the diodes are constructed as other field oxide transistors FOX-V, having gates that are connected to the second potential rail P2. Once again, it is advantageous for the field oxide transistors FOX-V to have a mutual spacing of at most 10 mm, and for them to be disposed at regular intervals relative to one another.

Some integrated semiconductor circuits have a plurality of potential rails, which then represent a kind of potential bus, for one and the same supply potential. Integrated semiconductor circuits according to the invention with overvoltage protection configurations that have a plurality of such potentials rails are described below. In the associated drawing figures, for the sake of simplicity, only the provisions that are related to such potential rails are shown.

Figure 15:
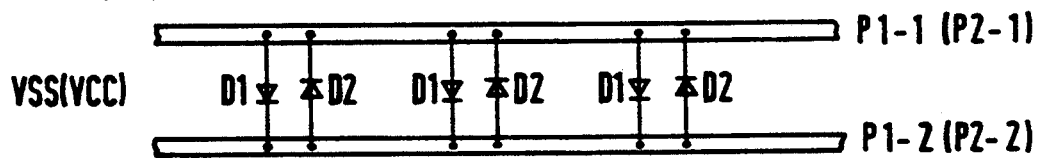

FIG. 15 shows two first potential rails P1, which are indicated by reference symbols P1-1 and P1-2. During operation, they are assumed to carry the first supply potential VSS of the integrated semiconductor circuit of the invention. According to the invention, the potential rails P1-1, P1-2 are connected to one another by at least one pair of diode devices D1, D2 (three pairs are shown). The diode devices D1, D2 of each pair are connected antiparallel to one another. In FIG. 15, each diode device D1 and D2 includes a single diode, In FIG. 16, it is shown that each diode device D1 and D2 may contain more than one diode, for example two diodes D1-1, D1-2 and D2-1, D2-2.

It is accordingly also advantageous if a plurality of rails P2-1, P2-2 are present as the second potential rail P2 (for the second supply potential VCC). This situation can also be found in FIGS. 15 and 16, wherein it is represented by the corresponding reference symbols in parentheses.

Figure 17:
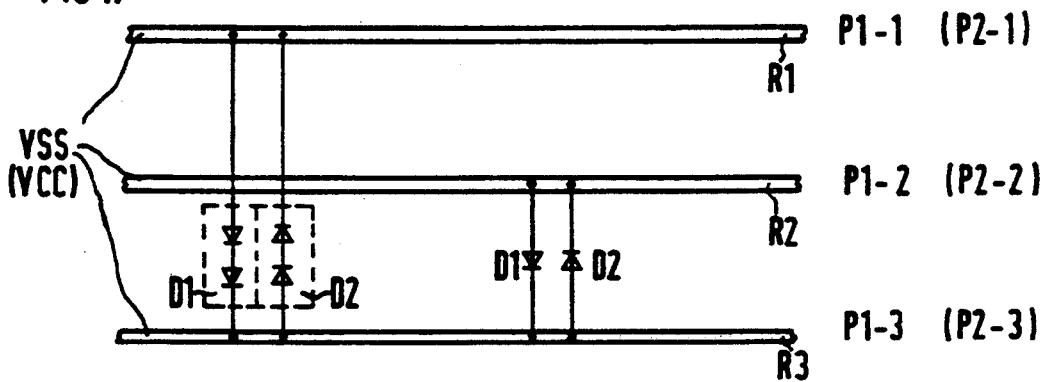

One skilled in the art will surely readily appreciate that a plurality of potential rails for one and the same supply potential (such as a plurality of first potential rails P1-1, P1-2, P1-3 for the first supply potential VSS) may have various ohmic resistors as conductor track resistors (for instance resulting from different lengths and/or cross sections of their conductor tracks). One such case is illustrated in FIG. 17 in terms of three first potential rails P1-1, P1-2, P1-3 (or three second potential rails P2-1, P2-2, P2-3, in accordance with the reference symbols in parentheses in FIG. 17). The various conductor track resistors are then indicated at reference symbols R1, R2, R3, on the assumption that the resistor R3 has the lowest resistance. In such a case, it is advantageous if the potential rails having the higher values for the conductor track resistors, for example the potential rails P1-1, P1-2 (or P2-1, P2-2) with the resistances R1 and R2) are connected in a star pattern or radially, through the pairs of antiparallel-connected diode devices D1, D2, with the particular conductor track that has the lowest resistance (R3). In FIG. 17, this is the potential rail P1-3 (or P2-3).

Figure 16:
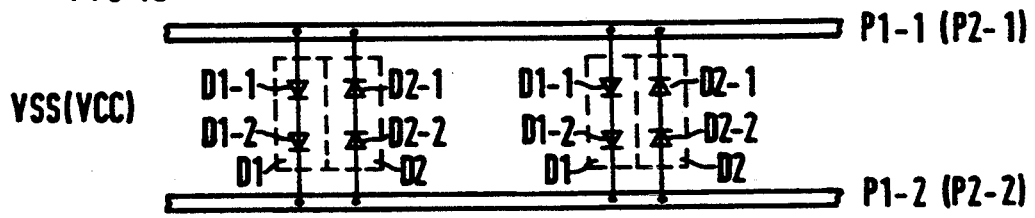
Figure 18:
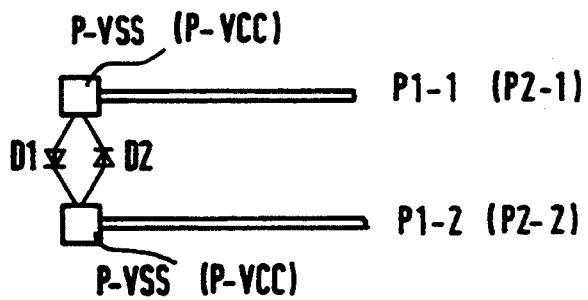
Figure 19:
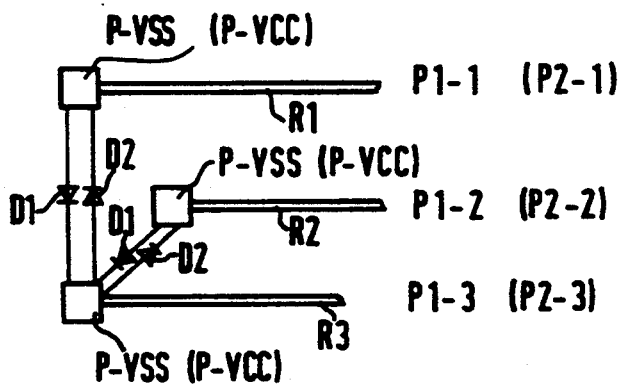

It is also possible for the plurality of first potential rails P1-1, P1-2 (or, the plurality of second potential rails P2-1, P2-2) each to have its own potential terminals P-VSS (or P-VCC) on the semiconductor chip of the integrated semiconductor circuit. In such cases it is advantageous, as is shown in FIGS. 18 and 19, not to connect the aforementioned diode devices D1, D2 to the potential rails P1-1, P1-2, or optionally P1-3 (or P2-1, P2-2, and optionally P2-3), as is seen in FIGS. 15–17, but rather to the respective potential terminals P-VSS (and P-VCC, respectively). FIG. 19 shows a situation corresponding to FIG. 17, that is a star-shaped connection of the potential terminals P-VSS (and P-VCC, respectively).

Figure 20:
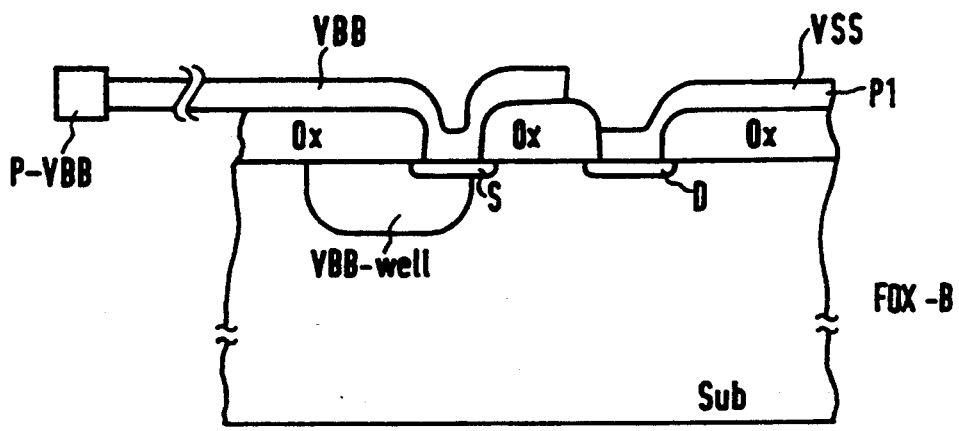
Figure 21:
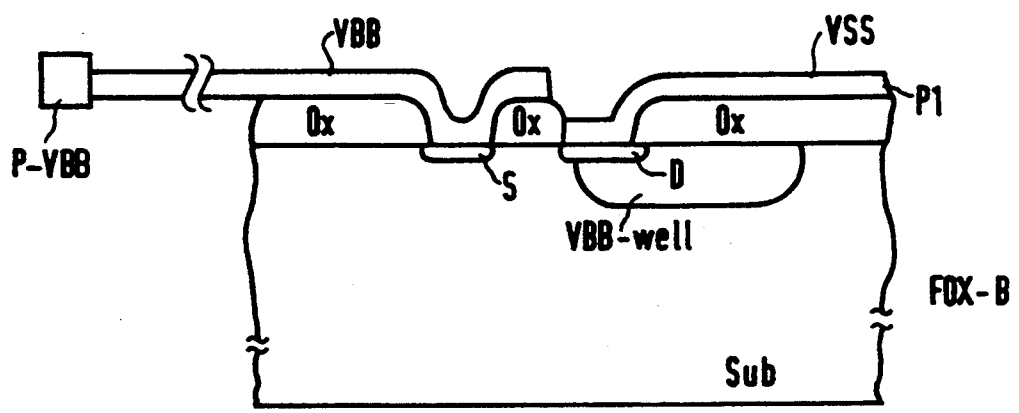

FIGS. 20 and 21 show advantageous ESD protection provisions for integrated semiconductor circuits that have one or more terminals P-VBB on their semiconductor chip for a substrate bias potential VBB that the semiconductor circuit carries during operation. In the past, the substrate bias potential VDD was delivered from the outside through a pin located on the housing, to such a terminal P-VBB located on the chip of the integrated semiconductor circuit. This is no longer conventional today, since today the substrate bias potential VBB is usually generated internally in the chip by means of substrate bias generators, so that this external terminal can be omitted. Nevertheless it is still possible for an integrated semiconductor circuit with an internal substrate bias generator to continue to have such an external terminal, which carries the substrate bias potential VBB during operation, for instance for measurement and/or test purposes. Moreover, it is also possible for such an integrated semiconductor circuit to have no external terminal in the form of a pin for the substrate bias voltage VBB, but nevertheless (for instance for reasons that may reside in the assembly technique employed when the chip is embedded in the housing) the semiconductor chip may have such a terminal P-VBB, to which a chip-external line (or more than one such line) is connected, that is carried in the housing of the integrated semiconductor circuit and ends flush with the surface of the integrated semiconductor circuit (typically at the end surface, in integrated semiconductor circuits in DIL or DIP housings).

This serves the purpose of mechanical stabilization of the spider or spider holder, for instance, with respect to the semiconductor chip during the process of assembling the chip in the housing.

In all of these situations described above, in which an electric line is carried from a terminal P-VBB of the chip to the surface of the housing of the integrated semiconductor circuit, or even through it in the form of a pin, it is appropriate to protect this terminal P-VBB against ESD phenomena since by means of this line ESD phenomena can affect the terminal P-VBB and thus the integrated circuit.

FIG. 20 shows an advantageous embodiment of this kind of protection. Disposed between the terminal P-VBB for the substrate bias potential VBB and the first potential rail P1 is a field oxide transistor FOX-B, having a gate which is connected to the terminal P-VBB. The field oxide transistor FOX-B has a further tub-like region VBB-well below its source region S.

A further version is shown in FIG. 21. It differs from the version of FIG. 20 only in that the further tub-like region VBB-well is disposed beneath the drain region D of the field oxide transistor FOX-B, rather than beneath the source region S.

We claim:

1. An integrated semiconductor circuit, comprising:
   a semiconductor substrate;
   at least one first potential rail carrying a first supply potential of the semiconductor circuit during operation;
   at least one second potential rail carrying a second supply potential of the semiconductor circuit during operation;
   at least one input signal line having at least one input signal terminal;
   at least one output signal line having at least one output signal terminal and at least one additional line connected to said output signal terminal;
   at least one first circuit portion for receiving and processing input signals;
   at least one second circuit portion developing at least one output signal of the semiconductor circuit during operation of the semiconductor circuit;
   a configuration for protection against overvoltages having a first protection circuit for each input signal terminal being connected between a respective input signal terminal and a respective first circuit portion, and having a second protection circuit for each output signal terminal being connected to said additional line;
   said first protection circuit having:
      a field oxide transistor and a field-controlled diode disposed electrically parallel with one another between said input signal line and said first potential rail, said field oxide transistor having a gate being connected to said input signal line, said diode having a field control being effected through said first potential rail, and said field oxide transistor and said field-controlled diode being electrically connected to said input signal line at various points along said input signal line;
      a diffusion resistor in said input signal line between two of said points;
      said field oxide transistor having a source region, a drain region and respective tub-like regions being formed beneath said source and drain regions, being mutually spaced apart and both being of the same conduction type as said source and drain regions;
   said second protection circuit having:
      a field oxide transistor and a field-controlled diode disposed electrically parallel with one another between said additional line and said first potential rail, said field oxide transistor having a gate being connected to said additional line, said diode having a field control being effected through said first potential rail, and said field oxide transistor and said field-controlled diode being electrically connected to said additional line at various points along said additional line;
      a diffusion resistor in said additional line between two of said points;
      said field oxide transistor having a source region, a drain region and respective tub-like regions being formed beneath said source and drain regions, being mutually spaced apart and both being of the same conduction type as said source and drain regions; and
   said potential rails each having a region adjacent at least one of said protection circuits, and at least one of said potential rails having a tub-shaped protection structure disposed under said region, said protection structure being disposed in said substrate and being electrically conductively connected to a respective one of said potential rails.

2. The integrated semiconductor circuit according to claim 1, including a region being disposed between said protection structure and a corresponding one of said potential rails, having an increased doping as compared with said protection structure.

3. The integrated semiconductor circuit according to claim 1, wherein at least one of said protection structures extends as far as a respective one of said terminals.

4. The integrated semiconductor circuit according to claim 1, wherein said protection structures are at least 5 $\mu$m wide.

5. The integrated semiconductor circuit according to claim 1, wherein said protection structure has a width being at least 10% of a width of said potential rail disposed above said protection structure.

6. The integrated semiconductor circuit according to claim 1, wherein at least One of said protection structures has a conduction type being opposite a condition type of said semiconductor substrate.

7. The integrated semiconductor circuit according to claim 1, wherein at least one of said protection structures has a conduction type being the same as a conduction type of said semiconductor substrate.

8. The integrated semiconductor circuit according to claim 1, including an epitaxial layer on which said semiconductor substrate is disposed.

9. The integrated semiconductor circuit according to claim 1, wherein said at least one additional line has a lower impedance than said at least one output signal line.

10. The integrated semiconductor circuit according to claim 9, wherein said at least one output signal line has a resistance of at least two ohms.

11. The integrated semiconductor circuit according to claim 9, wherein said at least one output signal line has a resistance being distributed uniformly over a region between one of said terminals and said second circuit portion.

12. The integrated semiconductor circuit according to claim 1, further comprising additional tub-like regions outside said protection configuration of said semiconductor circuit, said additional tub-like regions having different potentials and being of the same conduction type as said tub-like regions of said field oxide transistor, and wherein said tub-like regions beneath said field oxide transistor of a respective one of said protection circuits have a mutual spacing being at most equal to a spacing between said additional tub-like regions.

13. The integrated semiconductor circuit according to claim 1, including a multiplicity of contacts electrically connecting said source and drain regions of said field oxide transistor of said first protection circuit with said respective underlying tub-like regions.

14. The integrated semiconductor circuit according to claim 13, wherein said tub-like regions of said first protection circuit additionally have a region of higher doping through which electrical contacting with said source and drain regions of said field .oxide transistor takes place.

15. The integrated semiconductor circuit according to claim 1, including a multiplicity of contacts electrically connecting said source and drain regions of said field oxide transistor of said second protection circuit with said respective underlying tub-like regions.

16. The integrated semiconductor circuit according to claim 15, wherein said tub-like regions of said second protection circuit additional have a region of higher doping through which electrical contacting with said source and drain regions of said field oxide transistor takes place.

17. The integrated semiconductor circuit according to claim 1, wherein said field oxide transistor of said first protection circuit is a finger transistor.

18. The integrated semiconductor circuit according to claim 1, wherein said field oxide transistor of said second protection circuit is a finger transistor.

19. The integrated semiconductor circuit according to claim 17, wherein said finger transistor has corners with finger tips, and at least said finger tips are chamfered.

20. The integrated semiconductor circuit according to claim 18, wherein said finger transistor has corners with finger tips, and at least said finger tips are chamfered.

21. The integrated semiconductor circuit according to claim 1, wherein said diffusion resistors have a large surface area.

22. The integrated semiconductor circuit according to claim 1, wherein said protection circuits are each disposed in the immediate vicinity of a respective one of said terminals.

23. The integrated semiconductor circuit according to claim 1, wherein said field-controlled diodes are zero voltage transistors.

24. The integrated semiconductor circuit according to claim 23, wherein said zero voltage transistors have gates each being in the shape of a barbell.

25. The integrated semiconductor circuit according to claim 23, further comprising additional transistors contained outside said protection configuration in the semiconductor circuit, said additional transistors each having a gate with a spacing from a respective source and from a respective drain thereof, and wherein said zero voltage transistors each have a gate with a spacing from a respective source and from a respective drain that amounts to at least 1.5 times a corresponding spacing in said additional transistors.

26. The integrated semiconductor circuit according to claim 1, including at least one pass gate transistor connected downstream of said first protection circuit.

27. The integrated semiconductor circuit according to claim 26, wherein said pass gate transistor has a gate receiving the second supply potential.

28. The integrated semiconductor circuit according to claim 26, wherein said pass gate transistor has a gate through which it is switched.

29. The integrated semiconductor circuit according to claim 26, further comprising additional transistors contained outside said protection configuration in the semiconductor circuit, said additional transistors each having a gate with a spacing from a respective source and from a respective drain thereof, and wherein said pass gate transistor has a source, a drain and a gate being spaced from said source and said drain by a spacing that amounts to at least 1.5 times a corresponding spacing in said additional transistors.

30. The integrated semiconductor circuit according to claim 1, including a molybdenum silicide layer connecting said source region of said field oxide transistor of at least one of said protection circuits to said first potential rail.

31. The integrated semiconductor circuit according to claim 1, including a resistor connecting said source region of said field oxide transistor of at least one of said protection circuits to said first potential rail, said resistor having a resistance being at least five times a resistance that would result if said source region of said field oxide transistor of said at least one protection circuit were connected to said first potential rail without said resistor.

32. The integrated semiconductor circuit according to claim 1, including a molybdenum silicide layer connecting said drain region of said field oxide transistor of at least one of said protection circuits to one of said lines.

33. The integrated semiconductor circuit according to claim 1, including a resistor connecting said drain region of said field oxide transistor of at least one of said protection circuits to one of said lines, said resistor having a resistance being at least five times a resistance that would result if said drain region of said field oxide transistor of said at least one protection circuit were connected to said one line without said resistor.

34. The integrated semiconductor circuit according to claim 1, including at least one diode being disposed between said first and second potential rails and blocking during normal operation of the semiconductor circuit.

35. The integrated semiconductor circuit according to claim 34, wherein said at least one diode is more than one diode being disposed at mutual spacings of a maximum of 10 millimeters.

36. The integrated semiconductor circuit according to claim 35, wherein said diodes are disposed at regular intervals.

37. The integrated semiconductor circuit according to claim 1, including at least one other field oxide transistor being disposed between said first and second potential rails and having a gate being connected to said second potential rail.

38. The integrated semiconductor circuit according to claim 37, wherein said at least one other field oxide transistor is a plurality of other field oxide transistors being disposed at mutual spacings of a maximum of 10 millimeters.

39. The integrated semiconductor circuit according to claim 38, wherein said other field oxide transistors are disposed at regular intervals.

40. The integrated semiconductor circuit according to claim 1, including at least one pair of two antiparallel-connected diode devices connecting together a plurality of said potential rails carrying the same supply potential during operation.

41. The integrated semiconductor circuit according to claim 40, wherein one of said diode devices has at least one series-connected diode.

42. The integrated semiconductor circuit according to claim 40, wherein said pairs of diode devices are connected in a star pattern to one of said potential rails having the lowest ohmic resistance.

43. The integrated semiconductor circuit according to claim 40, wherein said plurality of potential rails carrying the same supply potential during operation each have their own potential terminal, and said at least one pair of diode devices is connected to said respective potential terminals.

44. The integrated semiconductor circuit according to claim 43, wherein said pairs of diode devices are connected in a star pattern to that potential terminal of said potential rails having the same potential and being connected to said potential rail with the lowest ohmic resistance.

45. The integrated semiconductor circuit according to claim 1, including at least one terminal carrying a substrate bias potential during operation of the semiconductor circuit; a field oxide transistor being connected between said at least one terminal and said first potential rail and having a gate being connected to said at least one terminal; and one further tub-like region in said field oxide transistor being disposed at least partially beneath one of said drain and source regions.

46. An integrated semiconductor circuit, Comprising:
a semiconductor substrate;
at least one first potential rail carrying a first supply potential of the semiconductor circuit during operation;
at least one second potential rail carrying a second supply potential of the semiconductor circuit during operation;
at least one input signal line and at least one output signal line having terminals for carrying both an input signal and an output signal during operation;
at least one first circuit portion for receiving and processing input signals;
at least one second circuit portion developing at least one output signal of the semiconductor circuit during operation of the semiconductor circuit;
a configuration for protection against overvoltages having a protection circuit for each terminal being connected between a respective terminal and a respective first circuit portion;
said protection circuit having:
a field oxide transistor and a field-controlled diode disposed electrically parallel with one another between said input signal line and said first potential rail, said field oxide transistor having a gate being connected to said input signal line, said diode having a field control being effected through said first potential rail, and said field oxide transistor and said field-controlled diode being electrically connected to said input signal line at various points along said input signal line;
a diffusion resistor in said input signal line between two of said points;
said field oxide transistor having a source region, a drain region and respective tub-like regions being formed beneath said source and drain regions, being mutually spaced apart and both being of the same conduction type as said source and drain regions; and
at least one of said potential rails having a region adjacent said protection circuit, and at least one of said potential rails having a tub-shaped protection structure disposed under said region, said protection structure being disposed in said substrate and being electrically conductively connected to a respective one of said potential rails.

* * * * *